(12) United States Patent
Robertson et al.

(10) Patent No.: US 7,928,883 B2
(45) Date of Patent: Apr. 19, 2011

(54) MULTIPLE DIGITAL SIGNALS FROM A SINGLE INTEGRATED CIRCUIT

(75) Inventors: Neil C. Robertson, Lilburn, GA (US); Jose M. Fernandez, Lilburn, GA (US); Leo Montreuil, Atlanta, GA (US)

(73) Assignee: Cisco Technology, Inc., San Jose, CA (US)

( * ) Notice: Subject to any disclaimer, the term of this patent is extended or adjusted under 35 U.S.C. 154(b) by 40 days.

(21) Appl. No.: 12/403,704

(22) Filed: Mar. 13, 2009

(65) Prior Publication Data

US 2010/0231794 A1  Sep. 16, 2010

(51) Int. Cl.
 *H03M 1/12* (2006.01)
(52) U.S. Cl. ........................ 341/155; 341/141
(58) Field of Classification Search .................. 341/155, 341/159, 141, 139; 370/480; 348/731
See application file for complete search history.

(56) References Cited

U.S. PATENT DOCUMENTS

| 7,106,232 | B2 * | 9/2006 | Harberts et al. | 341/139 |
| 7,250,885 | B1 * | 7/2007 | Nairn | 341/141 |
| 7,292,170 | B2 * | 11/2007 | Kinyua et al. | 341/141 |
| 2009/0174822 | A1 * | 7/2009 | Pugel | 348/731 |
| 2009/0310624 | A1 * | 12/2009 | Flickner et al. | 370/480 |

OTHER PUBLICATIONS

Busson, P. et al., "A fully digital 1GHz Channel Stacking Switch for outdoor unit satellite dish, based on a CMOS65LPGP dual voltage transceiver," *Paper 65*, pp. 1-20 (Sep. 2008).

\* cited by examiner

*Primary Examiner* — Peguy JeanPierre

(57) ABSTRACT

Multiple digital signals from a single integrated circuit (IC) may be provided. The IC may receive an analog signal comprising a plurality of channels, convert the analog signal to a digital signal, and provide the digital signal to a plurality of digital channel tuners. The tuners may each select one of the plurality of channels and provide the selected channels as a plurality of digital output signals. A signal conditioner may be used to prepare the analog signal for digitization.

19 Claims, 6 Drawing Sheets

US 7,928,883 B2

MULTIPLE DIGITAL SIGNALS FROM A SINGLE INTEGRATED CIRCUIT

TECHNICAL FIELD

The present disclosure relates generally to converting analog signals into digital signals.

BACKGROUND

A set-top box may have multiple channel tuners enabling a user to, for example, watch one channel on their television while recording at least one different channel. Thus, the conventional strategy is to provide a separate channel tuner for each channel output. This often causes problems because each tuner consumes space and power and comes at an additional cost to manufacture. For example, each tuner must separately select an appropriate channel band, convert the selected band to an intermediate frequency (IF), and digitize the IF for output to a specific receiver.

BRIEF DESCRIPTION OF THE DRAWINGS

The accompanying drawings, which are incorporated in and constitute a part of this disclosure, illustrate various embodiments of the present invention. In the drawings.

DESCRIPTION OF EXAMPLE EMBODIMENTS

Overview

Figure 1:
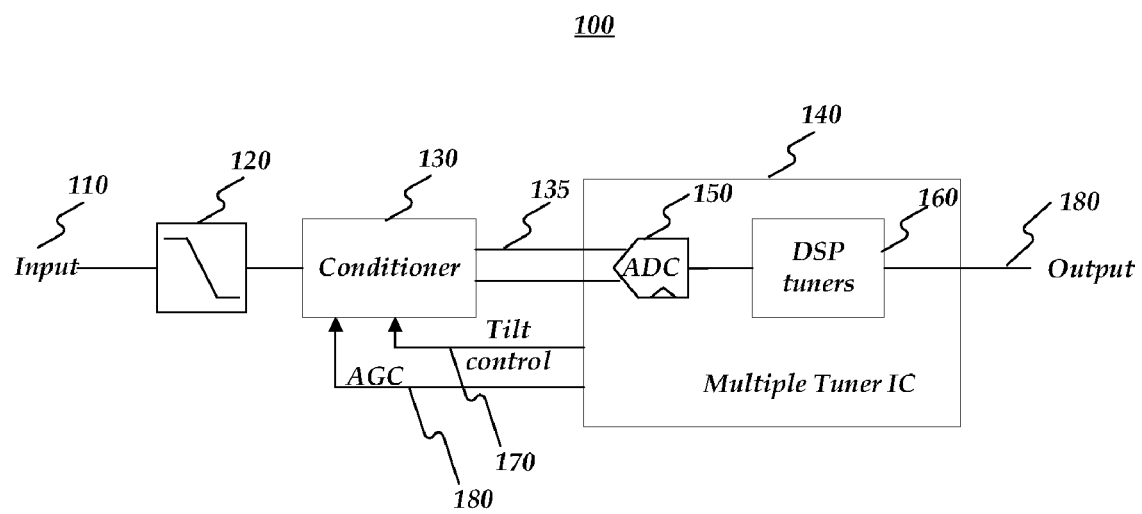
FIG. 1 is a block diagram of a system comprising a multiple tuner integrated circuit.

Consistent with embodiments of the present invention, systems and methods are disclosed for multiple cable television tuners in a single integrated circuit.

Multiple digital signals from a single integrated circuit (IC) may be provided. The IC may receive an analog signal comprising a plurality of channels, convert the analog signal to a digital signal, and provide the digital signal to a plurality of digital channel tuners. The tuners may each select one of the plurality of channels and provide the selected channels as a plurality of digital output signals. A signal conditioner may be used to prepare the analog signal for digitization.

It is to be understood that the foregoing overview and the following detailed description are explanatory only, and should not be considered to restrict the invention's scope, as described and claimed. Further, features and/or variations may be provided in addition to those set forth herein. For example, embodiments of the invention may be directed to various feature combinations and sub-combinations described in the detailed description.

DETAILED DESCRIPTION

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

Multiple cable television (CATV) tuners in a single integrated circuit (IC) may be provided. Consistent with embodiments of the present invention, an analog source signal such as a cable television signal may be converted to a digital signal and processed by multiple channel tuners. An analog to digital converter may digitize the CATV signal and digital signal processing (DSP) tuners separately tune each desired channel to provide multiple channel signal outputs. This allows a single device to receive the entire analog CATV signal band and output multiple digital signals to televisions to display a different channel for each tuner. Consistent with embodiments of the invention, the tuned channel outputs of each of the channel tuners may be multiplexed and output via a high-speed serializer for further processing.

FIG. 1 is a block diagram of a system 100 comprising a multiple tuner integrated circuit. For example, system 100 may comprise, for example, a complementary metal-oxide-semiconductor (CMOS) device. In system 100, an analog input signal 110 may be provided to a low-pass filter 120 that may be operative to remove frequency components of analog input signal 110 above an expected maximum. For example, analog input signal 110 may comprise a plurality of quadrature amplitude modulation (QAM) cable television (CATV) signals comprising frequency components between 54 MHz and 1002 MHz. Low pass filter 120 may operate to remove frequency components above 1002 MHz in order to prevent aliasing of these components during digitization. Low pass filter 120 may send a filtered signal to a signal conditioner 130 that further processes the signal before sending a conditioned signal 135 to a multiple tuner IC 140. Multiple tuner IC 140 may comprise an analog-to-digital converter (ADC) 150 and a plurality of DSP tuners 160. Multiple tuner IC 140 may provide control feedback to signal conditioner 130 via a tilt control signal 170 and/or an automatic gain control (AGC) signal 180. Multiple tuner IC 140 may produce at least one digital output signal 180.

Figure 2:
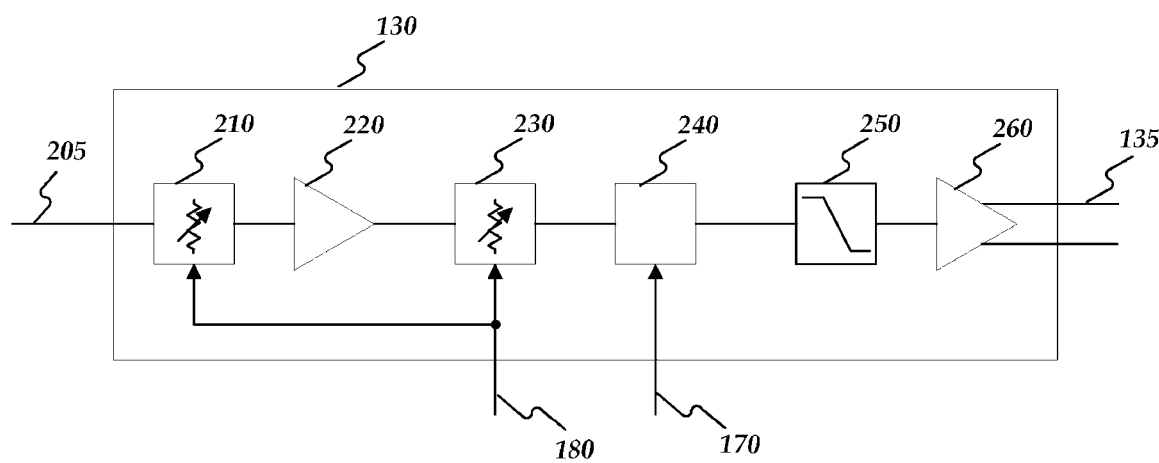
FIG. 2 is a block diagram of a signal conditioner.

FIG. 2 is a block diagram of signal conditioner 130. Signal conditioner 130 may receive a filtered signal 205 from low-pass filter 120. Filtered signal 205 may pass through an AGC comprising a first variable attenuator 210, an amplifier 220, and a second variable attenuator 230. First variable attenuator 210 and second variable attenuator 230 may receive AGC signal 180 that may comprise gain control instructions. For example, AGC signal 180 may maintain first variable attenuator 210 and second variable attenuator 230 at a 0 dB attenuation if filtered signal 205 is below a certain power threshold. As filtered signal 205 increases in power, second variable attenuator 230 may begin to attenuate filtered signal 205 after amplification by amplifier 220. If filtered signal 205 continues to increase in power, first variable attenuator 210 may begin to attenuate filtered signal 205 prior to amplification by amplifier 220.

Signal conditioner 130 may further comprise a tilt compensator 240 that may receive tilt control signal 170. Tilt compensator 240 may reduce tilt in the frequency components of filtered signal 205 in order to reduce dynamic range requirements for ADC 150. For example, a CATV signal transmitted on coaxial cable may have a frequency response such that insertion loss increases as a square root of frequency, resulting in a down-tilt of, for example, −6 dB from 54 to 1002 MHz. Up tilt may also be present on the CATV signal that may result in, for example, +6 dB tilt from 54 to 1002 MHz. Tilt compensator 240 may adjust for this insertion loss by varying a relative attenuation between the maximum frequency component and the minimum frequency component of filtered signal 205.

A low-pass filter 250 internal to signal conditioner 130 may provide anti-alias filtering. A driver amplifier 260 may then output conditioned signal 135. Consistent with embodiments of the invention, signal conditioner 130 may optimize conditioned signal 135 to ensure that conditioned signal 135 does not exceed a maximum range capability of ADC 150.

Figure 3:
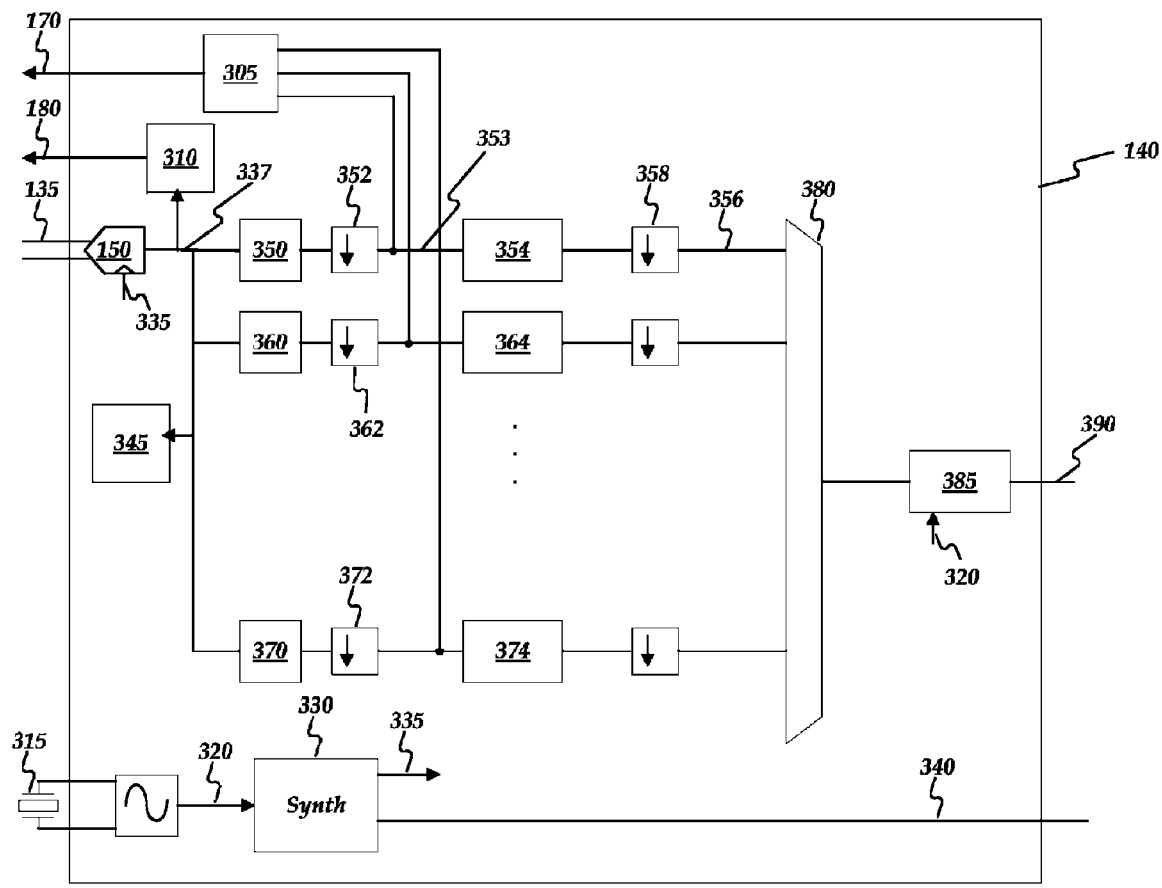
FIG. 3 is a block diagram of a multiple tuner integrated circuit comprising eight digital signal processing tuners.

FIG. 3 is a block diagram of multiple tuner integrated circuit (IC) 140 comprising eight digital signal processing tuners. Multiple tuner IC 140 may comprise an automatic tilt controller (ATC) 305 and an automatic gain controller (AGC) 310. ATC 305 and AGC 310 may provide tilt control signal 170 and AGC signal 180, respectively, to signal conditioner 130. Multiple tuner IC 140 may further comprise a crystal oscillator 315 producing a reference frequency 320 and coupled to a frequency synthesizer 330. Frequency synthesizer 330 may generate a clock frequency 335 used by components of multiple tuner IC 140 such as ADC 150. For example, when processing a CATV input signal having frequency components up to 1002 MHz, clock frequency 335 may comprise a frequency of 2.592 GHz, enabling a maximum sampling rate for ADC 150 greater than 2.4 times the maximum expected frequency component of conditioned signal 135. Consistent with embodiments of the invention, frequency synthesizer 330 may generate at least one additional clock frequency 340 that may be used by components of multiple tuner IC 140 and/or may be provided to other devices/components such as signal conditioner 130.

ADC 150 may sample conditioned signal 135 and produce a digitized signal 337 that may be monitored by AGC 310 and/or a clipping detector 345. Consistent with embodiments of the invention, ADC 150 may comprise a 12-bit output with a sample frequency of at least 2.4 GHz. Further consistent with embodiments of the invention, ADC 150 may comprise a 10-bit output.

Digitized signal 337 may be provided to a plurality of programmable band select filters (PBSF) such as a first PBSF 350, a second PBSF 360, and a third PBSF 370. Two, four, eight, and/or more band select filters may be provided, though not shown. Each PBSF may send a selected subset of the frequency components available on the digitized signal through a decimator operative to reduce a sample frequency of the signal to a digital signal processing (DSP) tuner. For example, first PBSF 350, second PBSF 360, and third PBSF 370 may send the selected subset through a first decimator 352, a second decimator 362, and a third decimator 372 to a first DSP tuner 354, a second DSP tuner 364, and a third DSP tuner 374, respectively. ATC 305 may monitor the output signal from each decimator and provide tilt control signal 170 to signal conditioner 130 as needed.

Decimator 352 may send a decimated signal 353 to DSP tuner 354. DSP tuner 354 may comprise a numerically controlled oscillator feeding an image reject mixer that may convert decimated signal 353 to an intermediate frequency (IF) signal 356. IF signal 356 may be passed through an IF decimator 358 in order to further reduce the sample rate. This sample rate reduction may facilitate data transfer from multiple tuner IC 140 to a subsequent chip for additional processing. For example, first DSP tuner 354 and IF decimator 358 may convert RF signal 355 from 300 Megasamples per second (MS/s) at 600 MHz to 13.5 MS/s at 6.75 MHz. The resulting output from each of the plurality of DSP tuners may be combined by a multiplexor 380 for output to a high speed serializer 385 prior to providing a single digital output signal 390. Tuning and decimation may be performed on the same IC so as to reduce a need for a high data rate transfer between different ICs. The output from high speed serializer 385 may be sent to another chip for additional processing such as demodulation.

Figure 4:
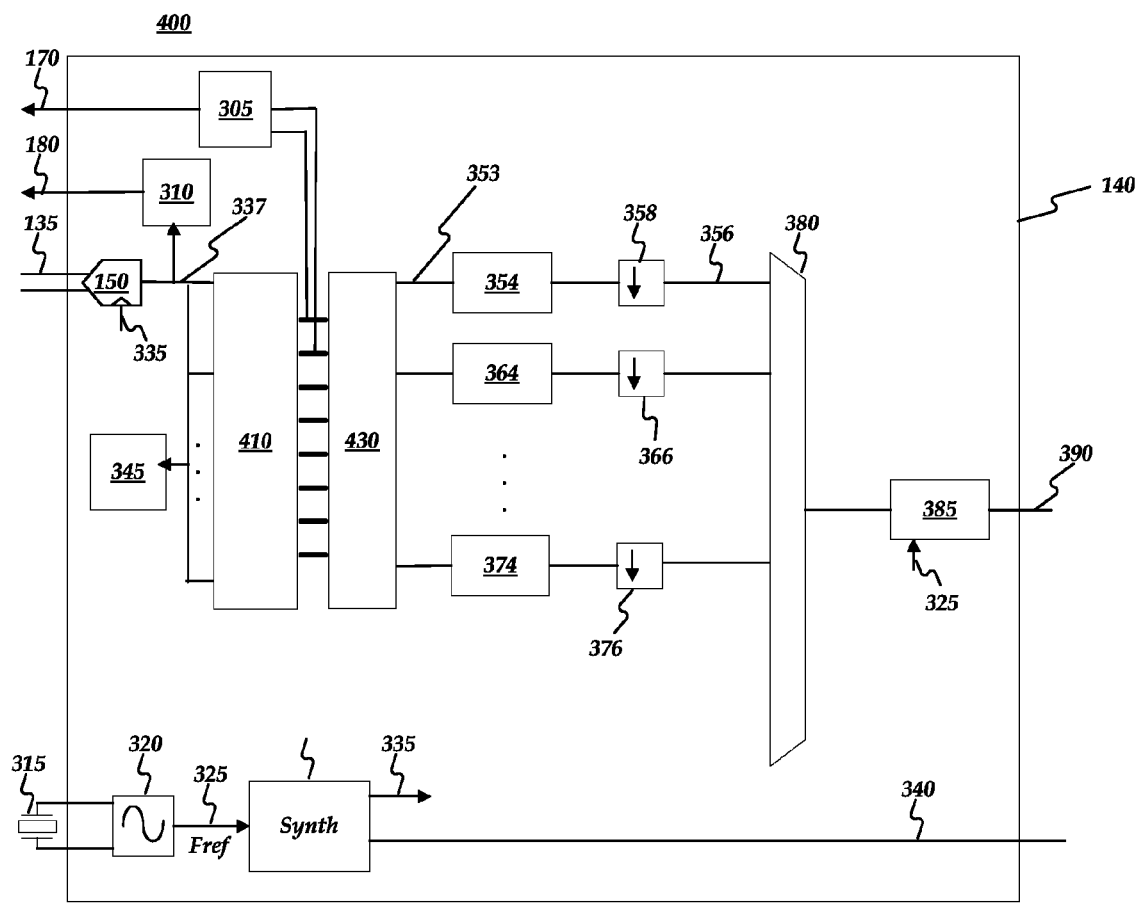
FIG. 4 is a block diagram of an alternate embodiment of a multiple tuner integrated circuit comprising eight digital signal processing tuners.

FIG. 4 is a block diagram of an alternate embodiment 400 of a multiple tuner integrated circuit comprising eight digital signal processing tuners. Rather than providing a plurality of programmable band select filters, alternate embodiment 400 may comprise a plurality of downconverters 410 coupled to a plurality of band select switches 430. ATC 305 may monitor the coupling between each downconverter and band select switch in order to provide control feedback to signal conditioner 130. Each of the plurality of band select switches may produce an output signal such as decimated signal 353 comprising a subset of the frequency components available on digitized signal 337.

Figure 5A:
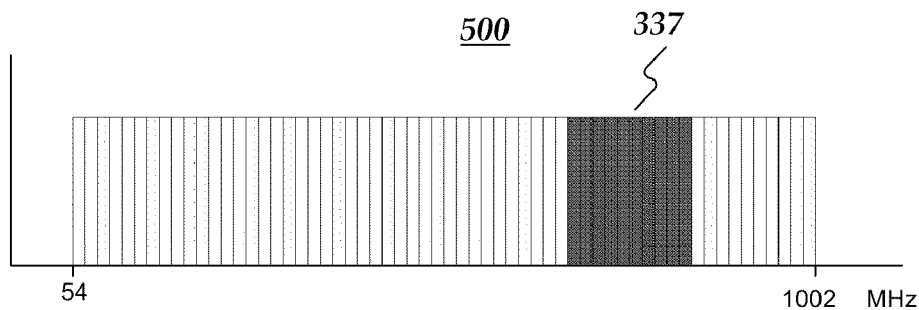
FIGS. 5A-5C are illustrations of a signal at various stages of processing within a single integrated circuit.
Figure 5B:
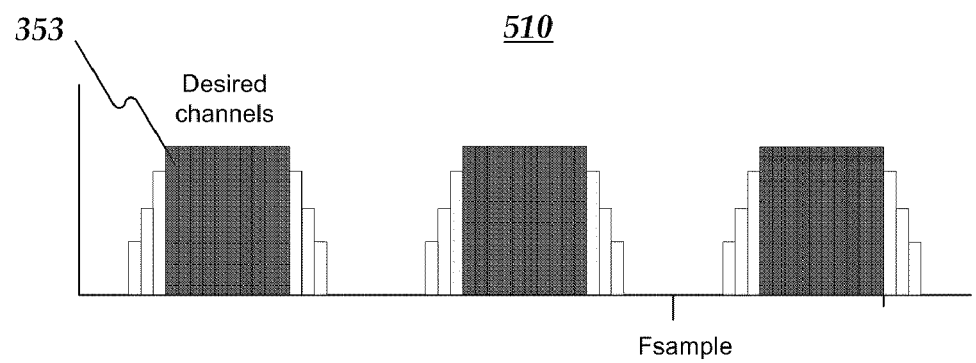
Figure 5C:
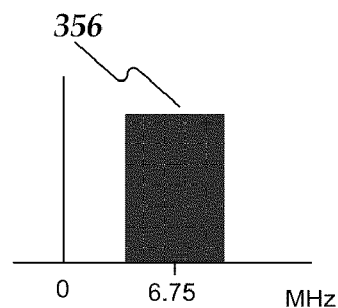

FIG. 5A is an illustration 500 of digitized signal 337 comprising the full range of frequency components where digitized signal 337 comprises a plurality of QAM CATV signals. FIG. 5B is an illustration 510 of RF signal 353 after selection of a subset of the frequency components of digitized signal 337 by first PBSF 350. FIG. 5C is an illustration 520 of IF signal 356 after tuning a selected channel from RF signal 353 by first DSP tuner 354.

Figure 6:
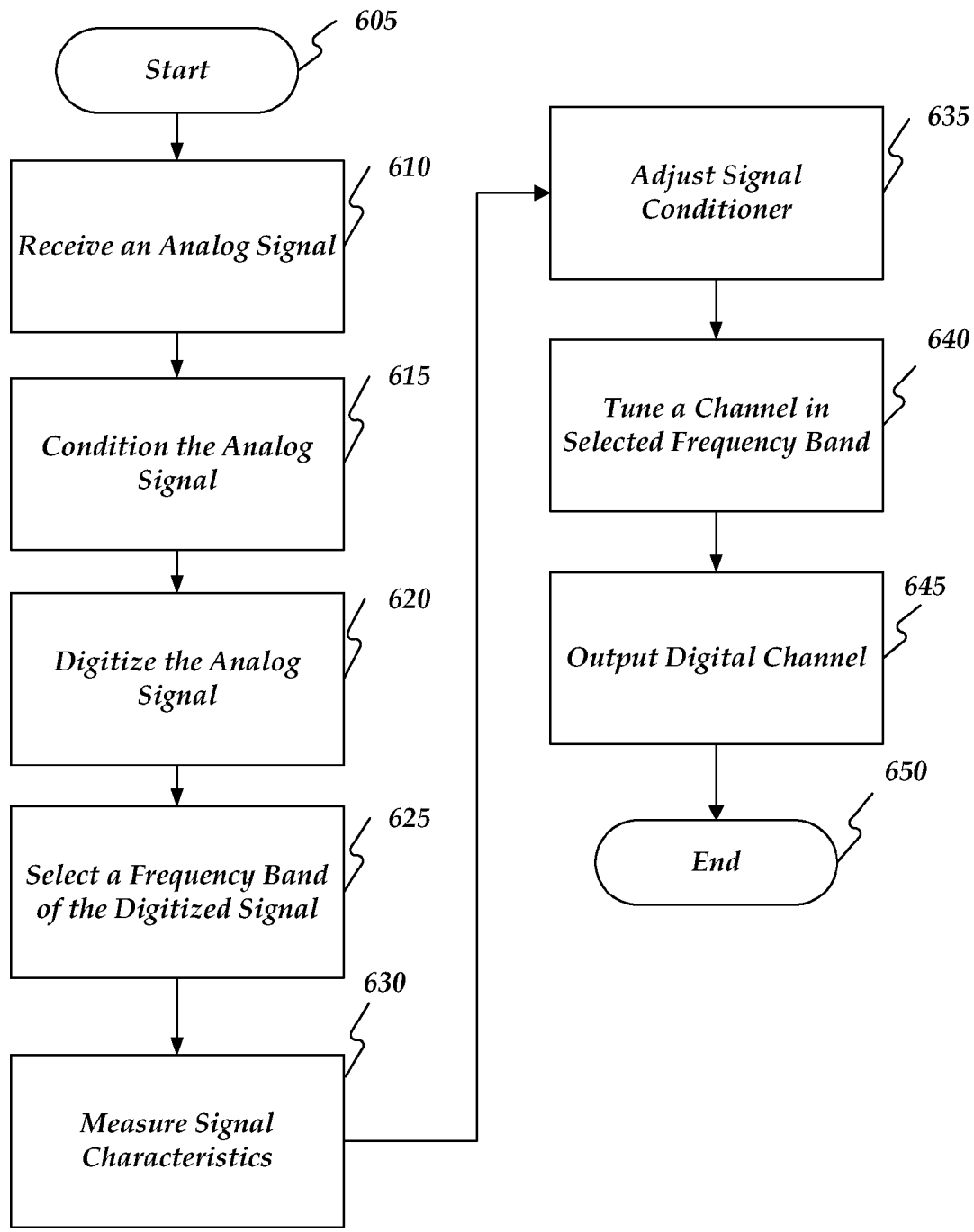
FIG. 6 is a flow chart of a method for providing multiple digital signals from a single integrated circuit.

FIG. 6 is a flow chart of a method 600 for providing multiple digital signals from a single integrated circuit. Method 600 may be implemented using an integrated circuit system such as system 100 as described in more detail above. Ways to implement the stages of method 600 will be described in greater detail below. Method 600 may begin at starting block 605 and proceed to stage 610 where system 100 may receive an analog input signal. For example, a CATV analog signal may be received comprising a plurality of QAM channels carried by a plurality of frequency components in a range from 54 MHz to 1002 MHz.

From stage 610 method 600 may advance to stage 615 where system 100 may condition the analog input signal. For example, the analog input signal may be processed by signal conditioner 130. Signal conditioning may comprise amplification, attenuation, and/or adjustment of a frequency response of the analog input signal (tilt control).

Consistent with embodiments of the invention, the analog input signal may be passed through a low-pass filter such as low-pass filter 120 prior to processing by signal conditioner 130. Consistent with further embodiments of the invention, the analog input signal may be divided into two separate signals comprising a lower half of the frequency components and an upper half of the frequency components by passing the analog input signal through a low-pass filter and a high-pass filter. The separated signals may then be conditioned and tuned separately.

From stage 615, method 600 may advance to stage 620 where system 100 may digitize the analog input signal. For example, signal conditioner 130 may send the conditioned signal to multiple tuner IC 140 wherein ADC 150 may convert the conditioned signal into a digitized signal. Consistent with embodiments of the invention, ADC 150 may sample to conditioned signal at a rate at least 2.4 times the maximum expected frequency component of the analog input signal. For the CATV signal comprising frequency components up to 1002 MHz, ADC 150 may operate at a sample rate of at least 2.4 GHz.

From stage 620, method 600 may advance to stage 625 where system 100 may select a frequency band of the digitized signal wherein the frequency band comprises a subset of the available frequency components on the digitized signal. For example, multiple tuner IC 140 may select a 100 MHz band of the digitized signal for each of the plurality of DSP tuners provided in multiple tuner IC 140 and output the selected frequency band as RF signal 353. Each of the plurality of DSP tuners may request any frequency band in order to tune any channel available on the CATV signal. Consistent with embodiments of the invention, multiple tuner IC 140 may provide a programmable band select filter (PBSF) such as PBSF 350 for each DSP tuner to select the frequency band for the respective DSP tuner. Consistent with further embodiments of the invention, multiple tuner IC 140 may provide plurality of downconverters 410 coupled to plurality of band select switches 430 in order to provide each of the plurality of DSP tuners with its selected frequency band.

From stage 625, method 600 may advance to stage 630 where system 100 may determine whether the signal conditioning performed at stage 615 should be modified. In response to determining that the signal conditioning should be modified, method 600 may advance to stage 635 where system 100 may adjust the signal conditioning. For example, AGC 310 may measure characteristics such as a power level of the digitized signal. AGC 310 may determine whether the monitored power level is greater than a maximum expected power level and adjust first variable attenuator 210 and/or second variable attenuator 230 to increase or decrease the attenuation of the analog input signal. ATC 305 may monitor each of the selected frequency band RF signals such as RF signal 353 and control tilt compensator 240 via tilt control signal 170 to adjust the frequency response of the analog input signal as needed. Clipping detector 345 may determine whether the digitized signal is exceeding an output range of ADC 150 and adjust a sensitivity threshold of ADC 150 to compensate.

After determining whether the signal conditioning needs to be modified at stage 630 and adjusting the signal conditioning as needed at stage 635, method 600 may advance to stage 640 where system 100 may tune a channel in each of the selected frequency bands. For example, the plurality of DSP tuners in system 100 may each tune a CATV channel frequency within the selected frequency band. Consistent with embodiments of the invention, each DSP tuner such as DSP tuner 354 may use a numerically controlled oscillator and image reject mixer to convert RF signal 353 to IF signal 356. IF signal 356 may comprise, for example, a single channel at 6.75 MHz and may be passed through decimator 358 to reduce a sampling rate to, for example, 27 MSa/s.

From stage 640, method 600 may advance to stage 645 where system 100 may output the digital channels. For example, the outputs of each of the plurality of DSP tuners may be multiplexed into a single bus by multiplexer 380. The bus may then be applied to high-speed serializer 385 and converted into a single digital output bit stream for presentation, display, and/or further processing. After computing system 100 outputs the digital channels in stage 645, method 600 may then end at stage 650.

An embodiment consistent with the invention may comprise a system for converting an analog signal into multiple digital signals. The system may comprise a signal conditioner and an integrated circuit comprising an analog-to-digital converter and a plurality of DSP tuners.

Another embodiment consistent with the invention may comprise a system for providing a plurality of digital channels. The system may comprise an input signal conditioner and a multiple tuner circuit. The multiple tuner circuit may be operative to convert an analog input signal into a digitized signal, select at least one channel from a plurality of channels carried by the digitized signal, and present the plurality of channels as a single digital signal.

Yet another embodiment consistent with the invention may comprise an apparatus for converting an analog signal into a digital signal. The apparatus may comprise an analog-to-digital converter, a frequency band selector, a plurality of DSP tuners, and a multiplexor. The ADC may be operative to digitize the analog signal comprising a plurality of modulated frequency components and pass the digitized signal to the frequency band selector. The frequency band selector may be operative to provide a plurality of signals each comprising a selected subset of the modulated frequency components to each of the plurality of DSP tuners. Each of the plurality of DSP tuners may be operative to tune a single channel from the received signal and output the channel to the multiplexor for combination into a single digital output signal.

Furthermore, embodiments of the invention may be practiced in an electrical circuit comprising discrete electronic elements, packaged or integrated electronic chips containing logic gates, a circuit utilizing a microprocessor, or on a single chip containing electronic elements or microprocessors. Embodiments of the invention may also be practiced using other technologies capable of performing logical operations such as, for example, AND, OR, and NOT, including but not limited to mechanical, optical, fluidic, and quantum technologies. In addition, embodiments of the invention may be practiced within a general purpose computer or in any other circuits or systems.

Embodiments of the present invention, for example, are described above with reference to block diagrams and/or operational illustrations of methods, systems, and computer program products according to embodiments of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the invention's scope is indicated by the following claims. Furthermore, while the specification has been described in language specific to structural features and/or methodological acts, the claims are not limited to the features or acts described above. Rather, the specific features and acts described above are disclosed as example for embodiments of the invention.

What is claimed is:

1. A method for converting an analog signal into a digital signal, the method comprising:
   receiving an analog signal comprising a plurality of channels;
   digitizing the analog signal;
   selecting a subset of the plurality of channels from the digitized analog signal, wherein each of the subset of the plurality of channels is selected for one of a plurality of digital signal processing tuners;
   providing each of the subset of the selected plurality of channels as a plurality of digital output signals from each of the plurality of digital signal processing tuners; and multiplexing each of the selected channels output by each of the plurality of digital signal processors into a single digital output signal.

2. The method of claim 1, further comprising conditioning the analog signal prior to digitizing the analog signal.

3. The method of claim 2, wherein conditioning the analog signal comprises at least one of the following: amplifying the analog signal and attenuating the analog signal.

4. The method of claim 2, wherein conditioning the analog signal comprises adjusting a frequency response of the analog signal.

5. The method of claim 2, further comprising, in response to at least one measured characteristic of the digitized analog signal, modifying the conditioning of the analog signal.

6. The method of claim 1, wherein digitizing the analog signal comprises passing the analog signal through an analog-to-digital converter operating at a sampling frequency of at least 2.4 times an expected maximum frequency component of the analog signal.

7. The method of claim 6, further comprising, prior to digitizing the analog signal, using a low-pass filter to remove frequency components above the expected maximum frequency component of the analog signal.

8. A system for providing a plurality of digital channels, the system comprising:
an input signal conditioner operative to condition an analog signal comprising:
at least one input filter operative to remove at least one frequency component from the analog signal,
at least one gain controller operative to attenuate the analog signal,
at least one tilt compensator operative to adjust a frequency response of the analog signal, and
at least one amplifier; and
a multiple tuner circuit operative to receive the analog signal from the input signal conditioner comprising:
an analog-to-digital converter operative to convert the analog signal into a digitized source signal,
a plurality of digital signal processing tuners each operative to select at least one channel from a plurality of channels carried by the digitized source signal and output the selected at least one channel as a digital channel output signal, and
a multiplexer operative to combine each of the digital output signals output by the plurality of digital signal processing tuners into a single digital signal.

9. The system of claim 8, wherein the analog signal comprises a cable television signal comprising a plurality of frequency components between 54 MHz and 1002 MHz.

10. The system of claim 9, further comprising at least one decimator operative to reduce a sample rate of at least one of: the digitized source signal and the digital channel output signal.

11. The system of claim 8, wherein the multiple tuner circuit further comprises a crystal oscillator coupled to a frequency synthesizer operative to generate a clock signal.

12. The system of claim 11, wherein a sampling rate of the analog-to-digital converter is controlled by the clock signal.

13. The system of claim 11, wherein the multiple tuner circuit further comprises a tilt control monitor operative to:
determine whether a tilt is occurring in the selected frequency band output by at least one of the programmable band select filters; and
provide a control signal to the tilt compensator of the input signal conditioner to adjust for the determined tilt.

14. The system of claim 8, wherein the multiple tuner circuit further comprises a plurality of programmable band select filters each associated with one of the plurality of digital signal processing tuners and operative to select a frequency band of the digitized source signal.

15. The system of claim 8, wherein the multiple tuner circuit further comprises a gain control operative to:
determine whether a power level of the digitized source signal is greater than a maximum expected power level; and
in response to determining that a power level of the digitized source signal is greater than a maximum expected power level, generate a control signal to the at least one gain controller of the input signal conditioner to attenuate the analog input signal.

16. An apparatus for converting an analog signal into a digital signal comprising:
an analog-to-digital converter operative to:
receive the analog signal, wherein the analog signal comprises a plurality of modulated frequency components, and
digitize the analog input signal;
a frequency band selector operative to provide a plurality of digital signals, wherein each of the plurality of digital signals comprises a subset of the plurality of modulated frequency components;
a plurality of digital signal processors each operative to:
receive at least one of the plurality of digital signals, and
output a selected channel from the received at least one of the plurality of digital signals; and
a multiplexor operative to:
receive each of the selected channels output by each of the plurality of digital signal processors, and
combine the received channels into a single digital output signal.

17. The apparatus of claim 16, wherein the frequency band selector comprises at least one of: a plurality of programmable band pass filters and a plurality of downconverters.

18. The apparatus of claim 17, further comprising a clipping detector operative to:
determine whether the digitized input signal is exceeding an output range of the analog-to-digital converter; and
in response to determining that the digitized input signal is exceeding the output range of the analog-to-digital converter, adjusting a level threshold of an automatic gain controller.

19. The apparatus of claim 16, further comprising at least one decimator operative to reduce the sample rate of the digitized analog input signal.

* * * * *